(12) United States Patent
Yegnashankaran et al.

(10) Patent No.: US 7,188,044 B1
(45) Date of Patent: Mar. 6, 2007

(54) WORLD-WIDE DISTRIBUTED TESTING FOR INTEGRATED CIRCUITS

(75) Inventors: Visvamohan Yegnashankaran, Redwood City, CA (US); Hengyang Lin, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/902,231

(22) Filed: Jul. 29, 2004

(51) Int. Cl.
*G06F 19/00* (2006.01)

(52) U.S. Cl. ............ 702/121; 702/117; 702/118; 702/119; 702/120; 702/182; 702/188; 709/226

(58) Field of Classification Search .......... 702/121, 702/117–120, 182, 188; 709/201–203, 223, 709/224, 226
See application file for complete search history.

(56) References Cited

U.S. PATENT DOCUMENTS

| | | | | | | |
|---|---|---|---|---|---|---|
| 4,397,021 | A | * | 8/1983 | Lloyd et al. | .................. | 714/33 |
| 4,402,055 | A | * | 8/1983 | Lloyd et al. | ................ | 702/121 |
| 4,760,330 | A | * | 7/1988 | Lias, Jr. | ....................... | 714/32 |
| 5,838,766 | A | * | 11/1998 | Rand | ............................ | 379/9 |
| 6,028,439 | A | * | 2/2000 | Arkin et al. | ................ | 324/765 |
| 6,557,128 | B1 | * | 4/2003 | Turnquist | ................... | 714/724 |
| 7,113,883 | B1 | * | 9/2006 | House et al. | ............... | 702/122 |

* cited by examiner

*Primary Examiner*—Marc S. Hoff
*Assistant Examiner*—Phuong Huynh
(74) *Attorney, Agent, or Firm*—Stallman & Pollock LLP

(57) ABSTRACT

An integrated circuit test method is provided that utilizes shared tester resources physically located at different geographical sites throughout the world to test specific integrated circuits, thereby maximizing utilization of all tester resources and, thereby, dramatically reducing the overall cost to test.

2 Claims, 1 Drawing Sheet

ID-WIDE DISTRIBUTED TESTING
FOR INTEGRATED CIRCUITS

FIELD OF THE INVENTION

The present invention relates to the testing of integrated circuits. More particularly, the invention is directed to an integrated circuit testing system that utilizes shared tester resources that are physically located at various geographical sites throughout the world, thereby maximizing utilization of all tester resources and dramatically reducing overall testing cost.

DESCRIPTION OF THE INVENTION

Figure 1:
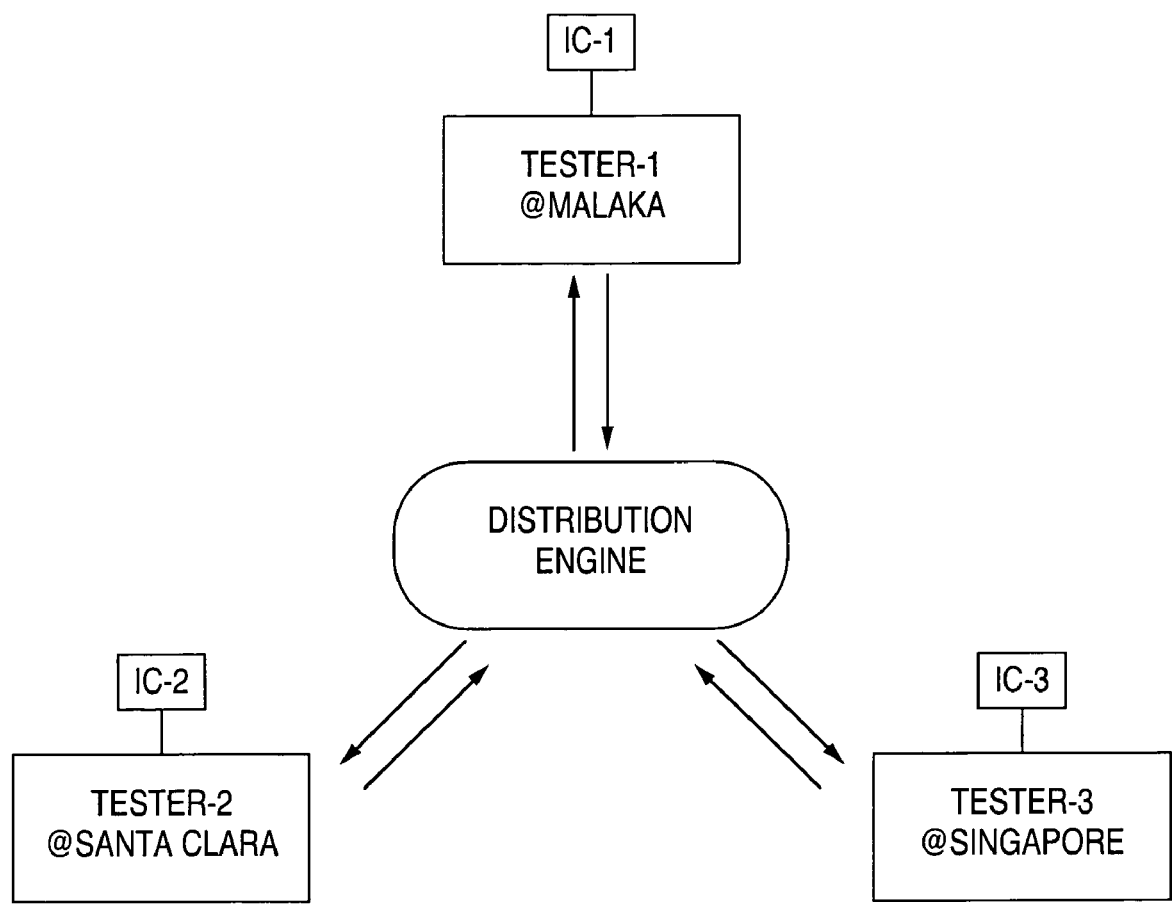
FIG. 1 is a flow chart illustrating a world-wide integrated circuit testing system in accordance with the present invention.

The process of evaluating the reliability and quality of an integrated circuit (IC) product is commonly called "testing." In an initial verification testing phase, prototype IC chips are tested to ensure that they meet their functional specification, i.e., to verify the correctness of the IC design and to ensure that all design rules have been followed. A second phase of testing is performed to ensure that only defect-free production chips are packaged and shipped to customers. These testing methods must be fast enough to be applied to large volumes of production chips and utilize large, expensive automatic test equipment (ATE). Another phase of testing, parametric testing, ensures that IC components meet design specifications for delays, voltages, power, etc.

The typical IC tester is a stand-alone piece of equipment that comprises a variety of electronic instruments such as, for example, waveform generators, pattern generators, voltage and current sources, and memories. These electronic instruments are generally referred to in the industry as "tester resources."

Different combinations of tester resources are needed for fully testing different types of ICs. Although some tester resource combinations are similar, others are very different. Therefore, to meet the variety of IC-type needs, today's commercially available testers are usually equipped with a variety of tester resources. However, for the majority of ICs, not all of the tester resources are needed at the same time when a specific IC is tested. Consequently, a portion of a tester's resources typically remains wastefully idle during a test operation.

The present invention provides a method that combines network technology and widely popular distributed computation technology into the IC testers so that idle resources not being used in the testing of a specific IC are shared globally where they are needed for a different type of IC.

Table I below provides a hypothetical case in which a first integrated circuit IC-1 is being tested on Tester-1, e.g. a LTX Fusion test system located at Malaka, Malaysia; an integrated circuit IC-2 is being tested on Tester-2, e.g. a Teradyne Flex test system, located at Santa Clara, Calif.; and a third integrated circuit IC-3 is being tested on Tester-3, e.g. another Teradyne Flex test system located at Singapore.

TABLE I

| Tester | Location | Device Under Test | Resource Under Test | Available resource for sharing |
| --- | --- | --- | --- | --- |
| Tester-1: LTX | Malaka | IC-1 | 80% | 20% |
| Tester-2: Teradyne | Santa Clara | IC-2 | 130% | −30% |
| Tester-3: Teradyne | Singapore | IC-3 | 90% | 10% |

The LTX Fusion test system is a system-on-a-chip (SOC) tester that tests integrated circuits that combine digital, mixed-signal, RF and smart power features on a single piece of silicon. The Teradyne Flex test system includes resources for testing DC, AC, digital, standard analog, mixed-signal and complex SOC. Of course, those skilled in the art will appreciate that identification of the LTX Fusion test system and the Teradyne Flex test system in this hypothetical test system is only for purposes of illustrating the concepts of the present invention and is in no way intended to limit the scope of the invention. Any of a wide variety of commercially available IC test systems that include a plurality of tester resources can be used in practicing the invention.

As further shown in Table I, in this hypothetical case, Tester-2 is 30% short of the tester resources needed to fully test IC-2. On the other hand, Tester-1 has a 20% surplus of the tester resources needed to fully test IC-1 and Tester-3 has a surplus of 10% of the tester resources needed to fully test IC-3. In this hypothetical case, with the currently utilized "segregated" approach to testing, IC-2 cannot be tested unless more resources are added to Tester-2; at the same time, 20% of Tester-1 and 10% of the tester resources of Tester-2

The FIG. 1 block diagram shows how this problem is solved in accordance with the concepts of the present invention. In accordance with the method illustrated in FIG. 1, some of the tests needed to fully test IC-2 are redistributed to Tester-1 and Tester-3 because both Tester-1 and Tester-3 have surplus idle tester resources that meet the needs for fully testing IC-2. Thus, by combining the tester resources available in Tester-2 with the idle resources available in Tester-1 and Tester-3, IC-2 can be fully tested more efficiently.

In FIG. 1, the Distribution Engine is a software engine similar to the well-known engines typically used in a computer farm. That is, the Distribution Engine is designed to execute three tasks. First, it detects unused tester resources in all locations. Second, it automatically translates a given type of tester-specific commands that are typically part of the test program used to drive the tester to another; for example, in the above-described hypothetical case, Tester-1 at Malaka is a LTX Fusion tester and Tester-2 at Santa Clara is Teradyne Flex tester. Third, the test results are combined and reported back to the master tester; that is, in the above hypothetical case, Tester-2 is the master tester to IC-2 and Tester-1 and Tester-3 are the slaves to IC-2. The Distribution Engine combines the test results received from Tester-1 and Tester-3 for IC-2, does the necessary translations, and sends the combined, translated results back to Tester-2.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A coordinated testing system for simultaneously testing a plurality of integrated circuit (IC) devices, the testing system comprising:

a plurality of IC test devices, each IC test device operable to perform a first test scheme on a first IC device under test by said IC test device, said first test scheme including one or more different tests available to be performed on said first IC device under test by said IC test device, such that one or more of said plurality of different tests available to be performed by said IC test device may be idle during performance of said first test scheme on said first IC device under test, each of the plurality of IC test devices being physically located at a geographical site that is distinct from the geographical location of the remainder of the plurality of IC test devices;

a distribution engine connected to each of the plurality of IC test devices for monitoring the IC test devices to identify idle tests in the plurality of IC test devices and to utilize the plurality of IC test devices to combine the idle tests to perform a second test scheme on a second IC device under test.

2. A method of simultaneously testing a plurality of integrated circuit (IC) devices, the method comprising:

providing a plurality of IC test devices, each IC test device operable to perform a first test scheme on a first IC device under test by said IC test device, said first test scheme including one or more tests available to be performed on said first IC device under test by said IC test device, such that one or more of said plurality of tests available to be performed by said IC test device may be idle during performance of said first test scheme on said first IC device under test, each of the plurality of IC test devices being physically located at a geographical site that is distinct from the geographical site of the remainder of the plurality of IC test devices;

connecting each of the plurality of IC test devices to a distribution engine, the distribution engine being operable to identify idle tests in the plurality of IC test devices and to utilize the plurality of IC test devices to combine the idle tests to perform a second test scheme on a second IC device under test.

* * * * *

UNITED STATES PATENT AND TRADEMARK OFFICE
CERTIFICATE OF CORRECTION

| | | |
|---|---|---|
| PATENT NO. | : 7,188,044 B1 | Page 1 of 1 |
| APPLICATION NO. | : 10/902231 | |
| DATED | : March 6, 2007 | |
| INVENTOR(S) | : Yegnashankaran et al. | |

It is certified that error appears in the above-identified patent and that said Letters Patent is hereby corrected as shown below:

In Column 3, lines 17-18, change "geographical location" to --geographical site--.

Signed and Sealed this

First Day of May, 2007

JON W. DUDAS
*Director of the United States Patent and Trademark Office*